United States Patent
Krupke

(10) Patent No.: US 9,985,410 B2
(45) Date of Patent: May 29, 2018

(54) RUBY LASER PUMPED ULTRASHORT PULSE LASER

(71) Applicant: William F. Krupke, Pleasanton, CA (US)

(72) Inventor: William F. Krupke, Pleasanton, CA (US)

(73) Assignee: WFK Lasers, LLC., Pleasanton, CA (US)

( * ) Notice: Subject to any disclaimer, the term of this patent is extended or adjusted under 35 U.S.C. 154(b) by 0 days. days.

(21) Appl. No.: 15/671,134

(22) Filed: Aug. 7, 2017

(65) Prior Publication Data
US 2018/0048111 A1    Feb. 15, 2018

Related U.S. Application Data

(60) Provisional application No. 62/494,583, filed on Aug. 15, 2016.

(51) Int. Cl.
*H01S 3/091*    (2006.01)
*H01S 3/11*    (2006.01)
(Continued)

(52) U.S. Cl.
CPC ............ *H01S 3/11* (2013.01); *H01S 3/0057* (2013.01); *H01S 3/0941* (2013.01);
(Continued)

(58) Field of Classification Search
CPC .... H01S 3/0941; H01S 3/0057; H01S 3/1623; H01S 3/1636; H01S 3/2316
See application file for complete search history.

(56) References Cited

U.S. PATENT DOCUMENTS 6,804,287 B2 * 10/2004 Backus ............... H01S 3/235
372/35
8,496,316 B2    7/2013 Karpushko
(Continued)

OTHER PUBLICATIONS

W. Koechner, Solid-State Laser Engineering, Springer-Verlag 3rd Edition, 1992, p. 116.
(Continued)

*Primary Examiner* — Michael Carter
(74) *Attorney, Agent, or Firm* — John P. Wooldridge

(57) ABSTRACT

An apparatus and method are provided for producing an ultrashort pulsed output beam. A 694 nm pump beam from a first GaN semiconductor laser diode pumped, Q-switched ruby laser is directed into at least one amplifier that includes a broadband gain element doped with trivalent chromium ions ($Cr^{3+}$). A spectrally linearly chirped low-intensity seed pulse from a master oscillator is directed into the at least one optically pumped amplifier to produce an amplified linear chirped pulsed output beam. A 694 nm second pump beam from a second GaN semiconductor laser diode pumped, Q-switched ruby laser is directed into a power amplifier that also includes a broadband gain element doped with trivalent chromium ions ($Cr^{3+}$). The amplified linear chirped pulsed output beam is directed into the optically pumped power amplifier to produce a high energy linear chirped pulsed output beam which is then directed into a pulse compressor to produce the ultrashort pulsed output beam.

8 Claims, 5 Drawing Sheets

(51) Int. Cl.
*H01S 3/0941* (2006.01)
*H01S 5/40* (2006.01)
*H01S 3/00* (2006.01)
*H01S 3/23* (2006.01)
*H01S 3/16* (2006.01)

(52) U.S. Cl.
CPC .......... *H01S 3/1623* (2013.01); *H01S 3/1636* (2013.01); *H01S 3/2316* (2013.01); *H01S 5/4025* (2013.01)

(56) References Cited

U.S. PATENT DOCUMENTS 8,780,440 B2 * 7/2014 Bayramian .......... H01S 3/0057
359/337.5
2009/0285248 A1 11/2009 Karpushko

OTHER PUBLICATIONS

A. E. Siegman, An Introduction to Lasers and Masers, McGraw-Hill Book Company, 1971, p. 398.
Klastech-Karpushko Laser Technologies, GmbH, Dortmund, Germany, Product Sheet, "Crescendo CW Ruby Laser", Jun. 2009.
J. Piprek, IEEE Journal of Quantum Electronics, 53 (1), 200104 (2017).

* cited by examiner

| Parameter | Ti:Al$_2$O$_3$ | ZnWO$_4$ | Al$_2$(WO$_4$)$_3$ | Sc$_2$(WO$_4$)$_3$ | GSGG | MgO | LiSAF |
|---|---|---|---|---|---|---|---|
| Pump λ$_{peak}$, nm | 490 | 690 | 660 | 690 | 650 | 650 | 650 |
| σ$_p$ (694 nm), 10$^{-19}$ cm$^2$ | 0.45 | 4.9 | ~4 | >1 | 0.07 | 0.1 | 0.25 |
| Laser λ, nm | 860 | 970 | 810 | 860 | 780 | 890 | 830 |
| Laser σ, 10$^{-19}$ cm$^2$ | 3.9 | 4.3 | 1.9 | 1.6 | 0.9 | 0.4 | 0.5 |
| Lifetime τ, μsec, 300 K | 3.1 | 0.5/5.2 | 16.2 | 2.4 | 120 | 30 | 67 |
| Lifetime τ, μsec, 4.2 K | 4.95 | 8.6 | 20 | 33 | 120 | --- | 67 |
| BW Δν, cm$^{-1}$ | 2900 | 1900 | 2080 | 2210 | 1540 | 2660 | 2625 |
| τ = 1/cΔν, fsec | 114 | 173 | 158 | 149 | 216 | 126 | 127 |

FIG. 5

RUBY LASER PUMPED ULTRASHORT PULSE LASER

CROSS-REFERENCE TO RELATED APPLICATIONS

This application claims the benefit of U.S. Provisional Patent Application No. 62/494,583 titled "Ruby DPSSL Pumped Ultrafast Laser," filed Aug. 15, 2016, incorporated herein by reference.

BACKGROUND OF THE INVENTION

Field of the Invention

The present invention relates to a ruby laser pumped ultrashort pulse laser, and more specifically, to an ultrashort pulse laser comprising a spectrally broadband emitting amplifier gain medium pumped directly by radiation at a wavelength of 694 nm from a Q-switched ruby ($Cr^{3+}:Al_2O_3$) laser.

Description of Related Art

The technique of chirp-pulse amplification (CPA) and pulse compression has been rendered using certain solid-state amplifier gain media that possess broadband gain spectra, resulting in ultrashort pulse laser systems that produce pulses with peak powers from terawatts (TW) to petawatts (PW), and with pulse durations from a few to several hundreds of femtoseconds. To realize such short output pulses, the gain spectrum of the gain medium utilized in the amplifier(s) of such systems must be adequately large. For example, to practically achieve an energetic ultrashort pulse with duration of 200 fsec ($10^{-15}$ sec), a gain medium is needed that manifests a broadband fluorescence spectrum with an energy width (full width at half maximum, FWHM) of at least nominally 300 $cm^{-1}$, and equivalently a spectral width of 30 nm at a peak wavelength of 1000 nm. Similarly, to practically achieve an energetic ultrashort pulse with duration of a few fsec, a gain medium is needed that manifests a broadband fluorescence spectrum with an energy width (FWHM) of at least nominally 2000 $cm^{-1}$, and equivalently a spectral width of 140 nm at a peak wavelength of 760 nm. In many of these prior art systems, broadband multi-pass amplification is provided by a titanium sapphire gain crystal (Ti:sapphire or TiS). This TiS gain crystal possesses an upper laser level lifetime of 3 microseconds, a broad pump band peaked in the green (530 nm) spectral region, and a broad emission band peaked in the deep red (760 nm) spectral region. TiS manifests a broadband fluorescence spectrum peaked at a wavelength of 760 nm with an energy width (FWHM) of nominally 2900 wavenumbers, and equivalently a spectral width of nominally 160 nm. TiS has been utilized to generate energetic ultrashort pulses with durations of less than a femtosecond. In all of these systems, gain at nominally 800 nm is produced by optically pumping the TiS crystal in the green (530 nm) excitation band, with an optical pump pulse whose duration is typically less than ~100 nanoseconds compared with the 3 microsecond fluorescence decay time of TiS. In such ultrashort pulse CPA-compressor systems, a master oscillator (MO) provides a low energy seed pulse with a duration of typically a nanosecond or so. The wavelength of this pulse is swept linearly from the beginning of the pulse to the end of the pulse (i.e. the pulse possesses a linear spectral chirp). This seed pulse is successively passed through pumped TiS amplifiers in a time short compared to the 3 microsecond energy storage lifetime of the TiS gain crystals, to greatly increase the 800 nm pulse energy. Successive passage through TiS gain crystals may be carried out in a regenerative laser cavity containing the gain crystal, or in other optical configurations well known in the art. The nominally 800 nm linearly chirped output pulse is then compressed in time to the femtosecond regime by removing the linear spectral chirp, for example, by suitably reflecting the pulse from an appropriate grating.

FIG. 1 shows a block diagram of a prior art ultrashort pulse CPA-compressor laser system. The system comprises two principal subsystems: a 530 nm Q-switched pump subsystem 7, and a CPA-compressor subsystem 10 that contains TiS broadband gain crystal(s). In the prior art system, the Q-switched 530 nm pump subsystem 7 shown in FIG. 1 employs a Q-switched neodymium doped laser 3 (crystal or glass). This medium is pumped by a flashlamp or by an infrared 808 nm laser diode 1. The broadband illumination of the flashlamp, or the output beam of the infrared laser diode 2 results in the generation of a short, multi-nanosecond, Q-switched output beam 4 from the neodymium laser, at a wavelength of 1060 nm. The wavelength of this beam 4 is then converted to an output beam 6 at a wavelength of 530 nm by passing it through a non-linear optical crystal 5 utilizing the process of phase-matched second harmonic generation (SHG). The 530 nm beam 6 is then used to pump a titanium doped sapphire crystal 8, which, in turn, produces an ultrashort pulse output beam 9 at a wavelength of 800 nm from the chirp pulse compressor subsystem 10, as is well known in the prior art.

Some prior art systems employ broadband flash lamps to optically pump the neodymium gain medium. This type of pumping is characterized by a large amount of waste heat generation and imposes a considerable thermal loading on the gain medium, thus greatly limiting the pulse repetition rate and average power of these prior art ultrashort pulse laser systems. Recently, to overcome this limitation, as higher average power systems are sought, broadband flashlamp pumping has been replaced by narrowband infrared laser diode pumping. This type of pumping of the neodymium gain medium greatly reduces waste heat generation and the thermal loading of the pumping subsystem, and significantly increases the allowed pulse repetition rate and average power of the ultrashort pulse laser output. At the same time, it is noteworthy that the energy storage lifetime of a neodymium doped gain medium is several hundred microseconds, and that efficient utilization of excitation energy requires that the duration of the excitation pulse be several hundred microseconds or less. It should be noted that a pump laser diode is a constant power device (it itself does not store energy), and would not be cost effectively utilized when operated at a low duty factor (small fraction of on time). It would be technically and economically advantageous to identify and utilize a neodymium replacement medium that could store energy for a much longer time, perhaps even milliseconds, to realize a more cost-effective use of pump laser diodes.

SUMMARY OF THE INVENTION

To overcome the disadvantages and limitations of prior art ultrashort pulse lasers, and to significantly advance the development of efficient, compact, cost-effective, repetitive-pulsed ultrashort pulse lasers, it is concluded that what is needed is:

Firstly, a pump laser gain medium replacing the prior art neodymium gain medium 3 of FIG. 1, that: 1) has an energy storage lifetime ideally in the millisecond range (for cost-effective utilization of pump diode); 2) has high thermal conductivity, high breaking strength, and relatively low thermal expansion and refractive index coefficients, facilitating significantly increased repetitive pulsing; 3) can be efficiently and cost-effectively pumped with pump laser diodes, mitigating deleterious thermal effects associated with broadband flashlamp pumping; and 4) has a Q-switched output wavelength that directly matches the demand pump wavelength of the broadband emitting gain medium, obviating the need to convert that output wavelength to a shorter wavelength, as in prior art systems, by the employment of a non-linear optic (NLO) crystal 5 in FIG. 1, thus significantly reducing the optical complexity of the pump laser subsystem hardware.

Secondly, a spectrally broadband emitting gain medium replacing the prior art TiS gain crystal 8 of FIG. 1 that: 1) has a pump band wavelength that is matched to the wavelength of the above described Q-switched pump laser; 2) has spectroscopic properties similar to TiS (energy storage lifetime in the microsecond regime, stimulated emission cross-section of ~E-19 $cm^2$, gain bandwidth >2000 $cm^{-1}$) to support generation of femtosecond duration pulses; and 3) has bulk optical, mechanical, and thermal properties enabling the achievement of high average power ultrafast lasers.

Taken together, the identification of these two complimentary and synergistic types of crystal gain media constitutes a new paradigm in diode-pumped, compact, cost-effective rep-pulsed, ultrashort pulse TW and PW lasers.

The present application identifies the following two types of gain crystals that, when taken together, overcome the limitations of the prior art systems discussed above, and satisfy the criteria set out above:

First, a ruby gain crystal that replaces the neodymium doped pump crystal, is pumped by a high bandgap semiconductor laser diode, and produces Q-switched laser output radiation at a wavelength of 694 nm; Second, at least one broadband gain medium that can be effectively pumped at a wavelength of 694 nm, and otherwise possesses required spectroscopic and physical characteristics. These latter gain media include the following crystals $Cr^{3+}:ZnWO_4$, $Cr^{3+}:Sc_2(WO_4)_2$, $Cr^{3+}:Al_2(WO_4)_2$, $Cr^{3+}:GSGG$, $Cr^{3+}:MgO$, $Cr^{3+}:LiSAF$, and $Cr^{3+}:phosphate$ glass. Other $Cr^{3+}$ doped dielectric hosts (crystal and glass) possessing suitable characteristics to be usefully pumped by a Q-switched ruby laser are anticipated to exist.

The descriptor "bandgap" in the previous paragraph refers to the difference (or gap) in energy between the top of the valance band and the bottom of the conduction band of the semiconductor material from which a laser diode is fashioned; the specific descriptor "high" bandgap GaN used herein, refers to the class of semiconductors whose lattice anions are nitrogen ions, and are generally referred to as "nitride" or "GaN" semiconductors. Nitride based laser diodes and LEDs have bandgap energies that fall in the range of about 3.5 eV to 2.3 eV (corresponding to emitted device near UV and visible wavelengths in the range of about 365 nm to 530 nm) depending on the relative amount of Al, Ga, and In incorporated into the nitride semiconductor device layers. In the present application, high bandgap GaN laser diodes emitting with a wavelength of 405 nm are of particular practical importance, being developed already to high commercial maturity for use in Blu-Ray high-density DVD recorders and players.

As mentioned above, to practically achieve an energetic ultrashort pulse with duration of 200 fsec ($10^{-15}$ sec), a gain medium is needed that manifests a broadband fluorescence spectrum with an energy width (full width at half maximum, FWHM) of at least nominally 300 $cm^{-1}$, and equivalently a spectral width of 30 nm at a peak wavelength of 1000 nm. Similarly, to practically achieve an energetic ultrashort pulse with duration of a few fsec, a gain medium is needed that manifests a broadband fluorescence spectrum with an energy width (FWHM) of at least nominally 2000 $cm^{-1}$, and equivalently a spectral width of 140 nm at a peak wavelength of 760 nm. Note that ultrashort laser systems produce pulses with peak powers from terawatts (TW) to petawatts (PW), and with pulse durations from a few to several hundreds of femtoseconds.

U.S. patent application Ser. No. 15/664,883, incorporated herein by reference, discloses embodiments of GaN pumped ruby lasers that are useable in the present invention.

Other objects and advantages will become obvious to the reader.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 5 is a comparison of key laser spectroscopic properties of $Ti:Al_2O_3$, $Cr^{3+}$ doped crystals: $ZnWO_4$, $Al_2(WO_4)_3$, $Cr^{3+}:Sc_2(WO_4)_3$, GSGG, MgO, and LiSAF.

DETAILED DESCRIPTION OF THE INVENTION

Figure 1:
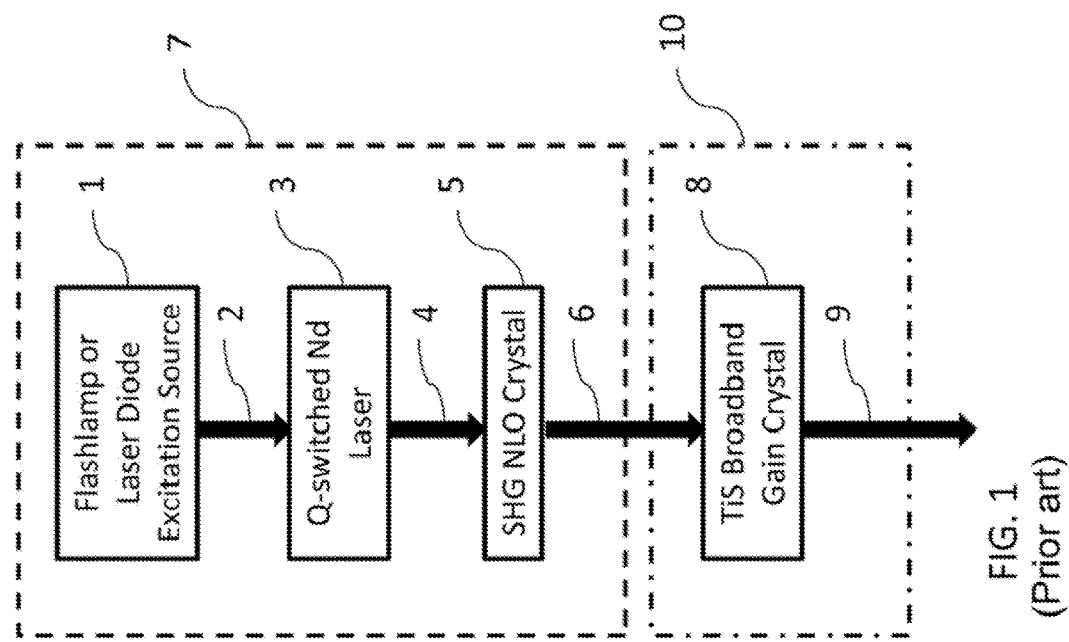
FIG. 1 is a block diagram of a prior art Ti:sapphire (TiS) based ultrashort pulse CPA-compressor laser, comprised of two main subsystems.
Figure 2:
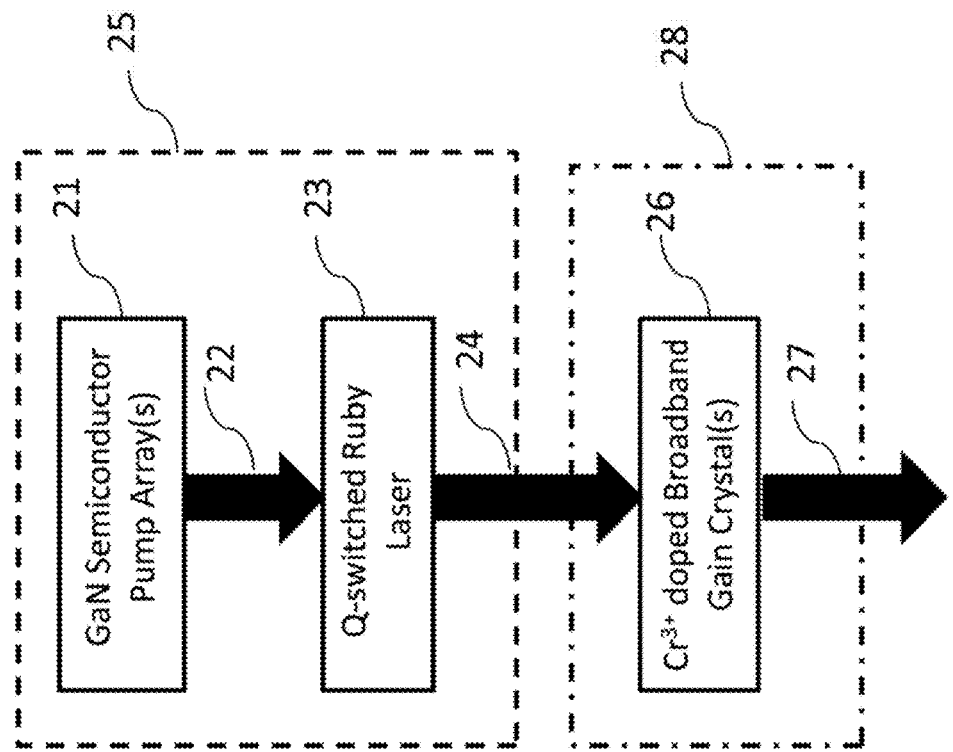
FIG. 2 is a block diagram of an ultrashort pulse CPA-compressor laser of the present invention, comprising a pump pulse subsystem based on GaN pumped ruby, and an ultrashort pulse CPA-compressor subsystem based on a chromium ($Cr^{3+}$) doped broadband gain medium.

FIG. 2 shows a block diagram of the ultrashort pulse CPA-compressor laser of the present invention. This laser system comprises two major subsystems: a Q-switched, 694 nm ruby pump pulse subsystem 25, and an ultrashort pulse CPA-compressor subsystem 28.

Subsystem 25 comprises a pump GaN laser diode (or diode array) 21 emitting an output beam 22 at a wavelength near 405 nm, and a Q-switched ruby laser 23 that generates a Q-switched output beam 24 at a wavelength of 694 nm, with characteristic pulse durations in the multi-tens of nanoseconds regime. Output beam 24 is used in turn to pump broadband chromium ($Cr^{3+}$) doped crystal (or crystals) 26 contained within a chirp pulse amplifier (CPA)-compressor type system 28, to produce ultrashort pulse output beam 27. Chirped pulse amplifier and compressor systems are known in the art. See, e.g., U.S. Pat. No. 8,780,440, titled "Dispersion Compensation in Chirped Pulse Amplification Systems," filed May 18, 2010, issued Jul. 15, 2014, incorporated herein by reference.

Figure 3:
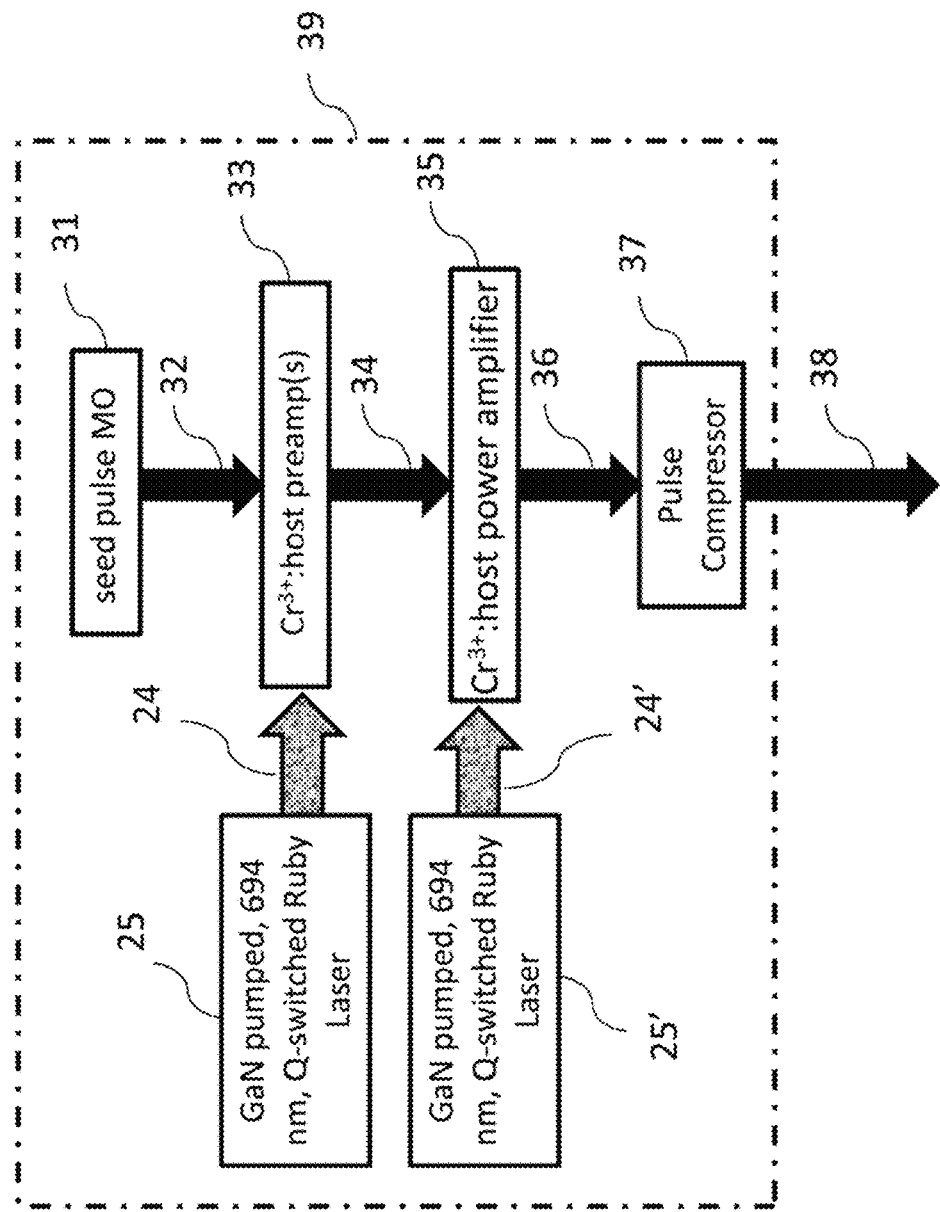
FIG. 3 is a more detailed block diagram of an ultrashort pulse CPA-compressor subsystem based on a chromium ($Cr^{3+}$) doped broadband gain medium that is directly pumped by one or more GaN laser diode pumped, Q-switched ruby lasers.

FIG. 3 shows in more detail a block diagram of the CPA-compressor subsystem 39 of the present invention. It comprises 1) a master oscillator (MO) 31 that provides a spectrally linearly chirped, low-intensity seed pulse 32; 2) a sequence of preamplifiers 33 containing broadband $Cr^{3+}$ doped gain elements that produce amplified linear chirped pulse output beam 34; 3) power amplifier stage 35 containing a broadband $Cr^{3+}$ doped gain element that produces high energy linear chirp pulse output beam 36; and 4) pulse compressor stage 37 that removes the linear chirp and produces time compressed ultrashort pulse output beam 38. Preamplifiers 33 are optically pumped by Q-switched output beam 24 from subsystem 25 of FIG. 2. Power amplifier 35 is optically pumped by Q-switched output beam 24' from subsystem 25'. Subsystem 25 and subsystem 25' are identical in type, but appropriately scaled in energy. Q-switched output beam 24 is identical in type to Q-switched output beam 24' but are also scaled in energy.

Figure 4:
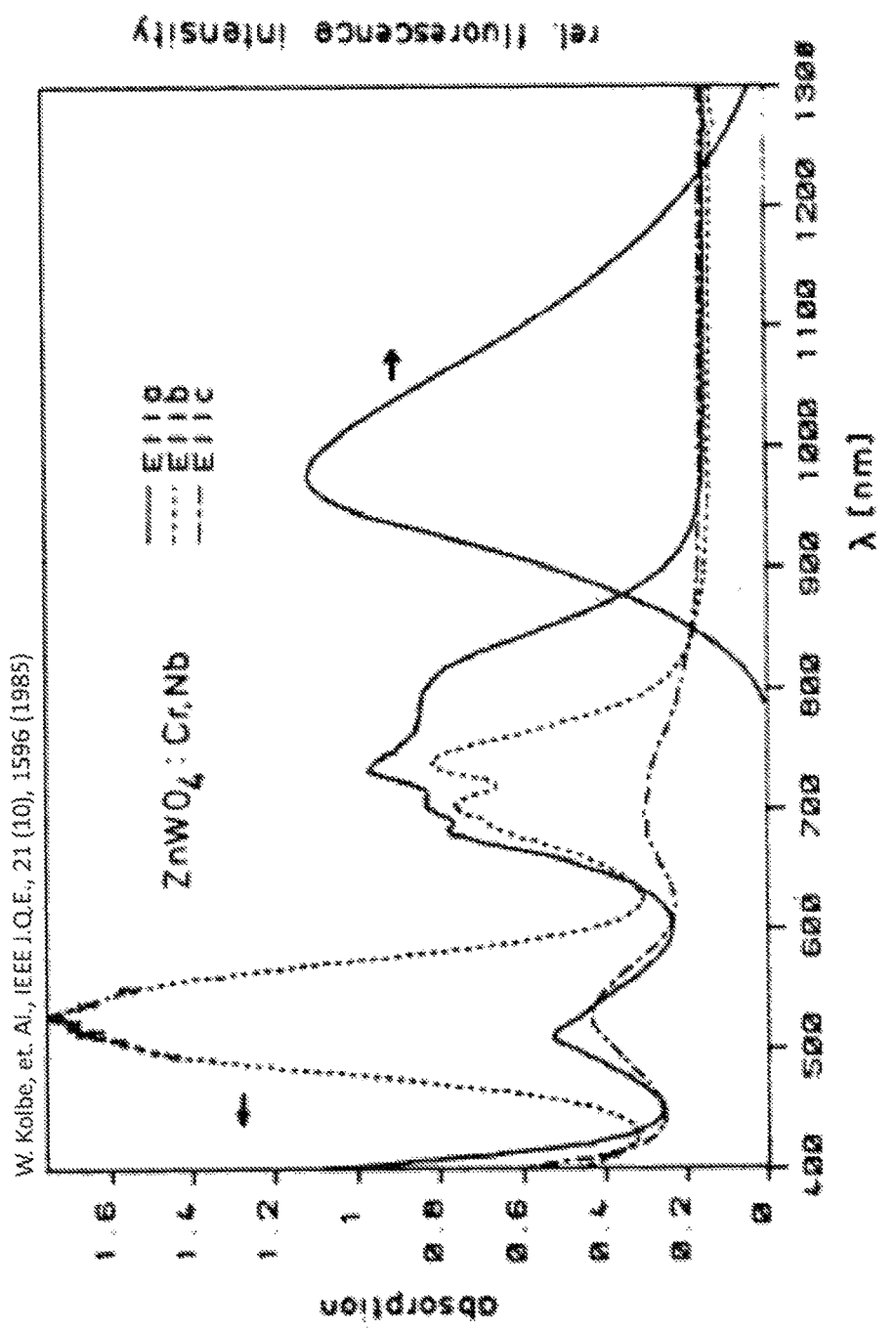
FIG. 4 shows plots of room temperature absorption and emission spectra of a $Cr^{3+}:ZnWO_4$ crystal.

At least several broadband gain media manifest laser spectroscopic and physical properties useful in the present invention, including but not limited to the following $Cr^{3+}$ doped crystals: $ZnWO_4$; $Al_2(WO_4)_3$; $Sc_2(WO_4)_3$; MgO, GSGG, LiSAF, and $Cr^{3+}$:phosphate glass. For example, FIG. 4 shows the polarized, absorption and emission spectra of $Cr^{3+}:ZnWO_4$ crystal at room temperature. Two broad pump bands lie at wavelengths shorter than about 900 nm, and a spectrally broad emission band lies at a wavelength longer than about 900 nm, peaked at a wavelength of about 1000 nm. This crystal manifests a strong, relatively broad absorption feature at 694 nm, matching the 694 nm output wavelength of the GaN pumped ruby Q-switched subsystem. This crystal also manifests a broadband emission peaked at 1000 nm, suitably broad to support the generation of sub-100 fsec pulses. The fluorescence lifetime of this emission is 5.4 microsecond, and is suitably long to permit effective, practical multi-pass/regen amplification. Broadband laser gain and laser emission at a wavelength of 1000 nm has been observed in a $Cr^{3+}:ZnWO_4$ laser.

The key laser spectroscopic parameters of $Cr^{3+}$ doped crystals $ZnWO_4$, $Al_2(WO_4)_3$, $Sc_2(WO_4)_3$, GSGG, MgO, and LiSAF are shown in FIG. 5, in comparison with those of $Ti^{3+}:Al_2O_3$ (TiS). These data indicate that all of the listed $Cr^{3+}$ doped crystals meet the criteria for effective use in the present invention.

Inspection of the spectroscopic literature reveals that certain $Cr^{3+}$ doped glasses offer spectroscopic characteristics quite similar to those listed in FIG. 5, and therefore can be considered as suitable for use in the present invention.

The foregoing description of the invention has been presented for purposes of illustration and description and is not intended to be exhaustive or to limit the invention to the precise form disclosed. Many modifications and variations are possible in light of the above teaching. For example, coupling optics may be used to direct a beam from one element to another, or a beam source may be pointed directly at a second element without intervening optics. These and other known beam directing techniques are considered herein to be "means for directing". The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

I claim:

1. An apparatus, comprising:
   a master oscillator configured to provide a spectrally linearly chirped low-intensity seed pulse;
   one or more preamplifiers, wherein each preamplifier of said one or more preamplifiers comprises a first broadband gain element doped with trivalent chromium ions ($Cr^{3+}$);
   one or more GaN semiconductor laser diode pumped, Q-switched ruby lasers, wherein each ruby laser of said ruby lasers is configured to provide a 694 nm preamplifier pump beam;
   means for producing one or more optically pumped preamplifiers by directing each said 694 nm preamplifier pump beam into its own preamplifier of said one or more preamplifiers;
   means for directing said seed pulse through each optically pumped preamplifier of said one or more optically pumped preamplifiers to produce an amplified linear chirped pulsed output beam;
   a power amplifier comprising a second broadband gain element doped with trivalent chromium ions ($Cr^{3+}$);
   a last GaN semiconductor laser diode pumped, Q-switched ruby laser configured to provide a 694 nm last pump beam;
   means for directing said last pump beam into said power amplifier to produce an optically pumped power amplifier;
   a pulse compressor; and
   means for directing said amplified linear chirped pulsed output beam into said pulse compressor to produce a time compressed ultrashort pulsed output beam.

2. The apparatus of claim 1, wherein said first broadband gain element and said second broadband gain element are doped with trivalent chromium ions ($Cr^{3+}$) selected from the group consisting of $Cr^{3+}:ZnWO_4$, $Cr^{3+}:Sc_2(WO_4)_2$, $Cr^{3+}:Al_2(WO_4)_2$, $Cr^{3+}:GSGG$, $Cr^{3+}:MgO$, $Cr^{3+}:LiSAF$, and $Cr^{3+}$:phosphate glass.

3. A method, comprising:
   producing one or more optically pumped preamplifiers by directing a 694 nm preamplifier pump beam from one or more GaN semiconductor laser diode pumped, Q-switched ruby lasers into its own preamplifier of one or more preamplifiers comprising a first broadband gain element doped with trivalent chromium ions ($Cr^{3+}$);
   directing a spectrally linearly chirped low-intensity seed pulse from a master oscillator through each optically pumped preamplifier of said one or more optically pumped preamplifiers to produce an amplified linear chirped pulsed output beam;
   directing a last pump beam into a power amplifier comprising a second broadband gain element doped with trivalent chromium ions ($Cr^{3+}$) to produce an optically pumped power amplifier, wherein said last pump beam is produced by a last GaN semiconductor laser diode pumped, Q-switched ruby laser configured to provide a 694 nm last pump beam;
   directing said amplified linear chirped pulsed output beam into said optically pumped power amplifier to produce a last linear chirped pulsed output beam; and
   directing said last linear chirped pulsed output beam into a pulse compressor to produce a time compressed ultrashort pulsed output beam.

4. The method of claim 3, wherein said first broadband gain element and said second broadband gain element are doped with trivalent chromium ions ($Cr^{3+}$) selected from the group consisting of $Cr^{3+}$:$ZnWO_4$, $Cr^{3+}$:$Sc_2(WO_4)_2$, $Cr^{3+}$:$Al_2(WO_4)_2$, $Cr^{3+}$:GSGG, $Cr^{3+}$:MgO, $Cr^{3+}$:LiSAF, and $Cr^{3+}$:phosphate glass.

5. An apparatus, comprising:
 a master oscillator configured to provide a spectrally linearly chirped low-intensity seed pulse;
 a preamplifier comprising a first broadband gain element doped with trivalent chromium ions ($Cr^{3+}$);
 a GaN semiconductor laser diode pumped, Q-switched ruby laser configured to provide a 694 nm preamplifier pump beam;
 means for directing said 694 nm preamplifier pump beam into said preamplifier to produce an optically pumped preamplifier;
 means for directing said seed pulse through said preamplifier to produce an amplified linear chirped pulsed output beam;
 a power amplifier comprising a second broadband gain element doped with trivalent chromium ions ($Cr^{3+}$);
 a last GaN semiconductor laser diode pumped, Q-switched ruby laser configured to provide a 694 nm last pump beam;
 means for directing said last pump beam into said power amplifier to produce an optically pumped power amplifier;
 a pulse compressor; and
 means for directing said amplified linear chirped pulsed output beam into said pulse compressor to produce a time compressed ultrashort pulsed output beam.

6. The apparatus of claim 5, wherein said first broadband gain element and said second broadband gain element are doped with trivalent chromium ions ($Cr^{3+}$) selected from the group consisting of $Cr^{3+}$:$ZnWO_4$, $Cr^{3+}$:$Sc_2(WO_4)_2$, $Cr^{3+}$:$Al_2(WO_4)_2$, $Cr^{3+}$:GSGG, $Cr^{3+}$:MgO, $Cr^{3+}$:LiSAF, and $Cr^{3+}$:phosphate glass.

7. A method, comprising:
 directing a 694 nm preamplifier pump beam from a GaN semiconductor laser diode pumped, Q-switched ruby lasers into a preamplifier comprising a first broadband gain element doped with trivalent chromium ions ($Cr^{3+}$) to produce an optically pumped preamplifier,
 directing a spectrally linearly chirped low-intensity seed pulse from a master oscillator through said optically pumped preamplifier to produce an amplified linear chirped pulsed output beam;
 directing a last pump beam into a power amplifier comprising a second broadband gain element doped with trivalent chromium ions ($Cr^{3+}$) to produce an optically pumped power amplifier, wherein said last pump beam is produced by a last GaN semiconductor laser diode pumped, Q-switched ruby laser configured to provide a 694 nm last pump beam;
 directing said amplified linear chirped pulsed output beam into said optically pumped power amplifier to produce a last linear chirped pulsed output beam; and
 directing said last linear chirped pulsed output beam into a pulse compressor to produce a time compressed ultrashort pulsed output beam.

8. The method of claim 7, wherein said first broadband gain element and said second broadband gain element are doped with trivalent chromium ions ($Cr^{3+}$) selected from the group consisting of $Cr^{3+}$:$ZnWO_4$, $Cr^{3+}$:$Sc_2(WO_4)_2$, $Cr^{3+}$:$Al_2(WO_4)_2$, $Cr^{3+}$:GSGG, $Cr^{3+}$:MgO, $Cr^{3+}$:LiSAF, and $Cr^{3+}$:phosphate glass.

* * * * *